United States Patent [19]

Beauducel

[11] Patent Number: 4,990,913

[45] Date of Patent: Feb. 5, 1991

[54] ANALOG TO DIGITAL CONVERTER FOR HIGHLY DYNAMIC SIGNALS, USING A VARIABLE REFERENCE VOLTAGE TO FLOATING DECIMAL POINT OUTPUT

[75] Inventor: Claude Beauducel, Henonville, France

[73] Assignee: Institut Francais du Petrole, Rueil Malmaison, France

[21] Appl. No.: 299,313

[22] Filed: Jan. 23, 1989

[30] Foreign Application Priority Data

Jan. 21, 1988 [FR] France .................. 88 00764

[51] Int. Cl.$^5$ .............................................. H03M 1/18
[52] U.S. Cl. ..................................... 341/139; 341/138; 341/155
[58] Field of Search ............... 341/122, 139, 141, 138, 341/126, 155, 156, 158, 159, 160

[56] References Cited

U.S. PATENT DOCUMENTS

| | | |
|---|---|---|
| 3,411,153 | 11/1968 | Steele . |
| 3,585,631 | 6/1971 | McCown . |
| 3,597,761 | 8/1971 | Fraschilla et al. ................ 341/156 |
| 3,603,972 | 9/1971 | Vanderford ...................... 341/139 |
| 3,699,325 | 10/1972 | Montgomery, Jr. et al. . |
| 3,813,609 | 5/1974 | Wilkes et al. .................... 341/139 |
| 3,919,657 | 11/1975 | Howlett et al. .................. 341/139 |
| 3,935,569 | 1/1976 | Marcel et al. .................... 341/138 |
| 3,936,819 | 2/1976 | Angelle et al. ................... 341/139 |
| 4,393,368 | 7/1983 | Rasmussen ....................... 341/156 |
| 4,449,120 | 5/1984 | Rialan et al. ..................... 341/141 |
| 4,454,500 | 6/1984 | Kato et al. ....................... 341/141 |
| 4,584,560 | 4/1986 | McDaniel et al. ................ 341/139 |
| 4,684,924 | 8/1987 | Wood ............................... 341/158 |

FOREIGN PATENT DOCUMENTS

| | | |
|---|---|---|
| 1481960 | 4/1967 | France . |
| 2580877 | 10/1986 | France . |
| 142823 | 6/1986 | Japan ................................. 341/139 |

*Primary Examiner*—William M. Shoop, Jr.
*Assistant Examiner*—Howard L. Williams
*Attorney, Agent, or Firm*—Antonelli, Terry, Stout & Kraus

[57] ABSTRACT

An acquisition device for digitizing highly dynamic signals. After amplification in a fixed gain amplifier, the signals are applied to a sample and hold unit, the output of which is connected to an analog-to-digital converter to which a variable reference voltage is applied. This reference voltage is available at the output of a multiplexer to the inputs of which voltages are applied derived from sub-divisions of a calibrated voltage. The choice of the reference voltage is effected by a logic assembly as a function of the comparisons made by comparators between the sampled voltage and the derived voltages. The digitized signals are represented by a digital word from the converter and a digital word of gain G from the logic assembly.

11 Claims, 1 Drawing Sheet

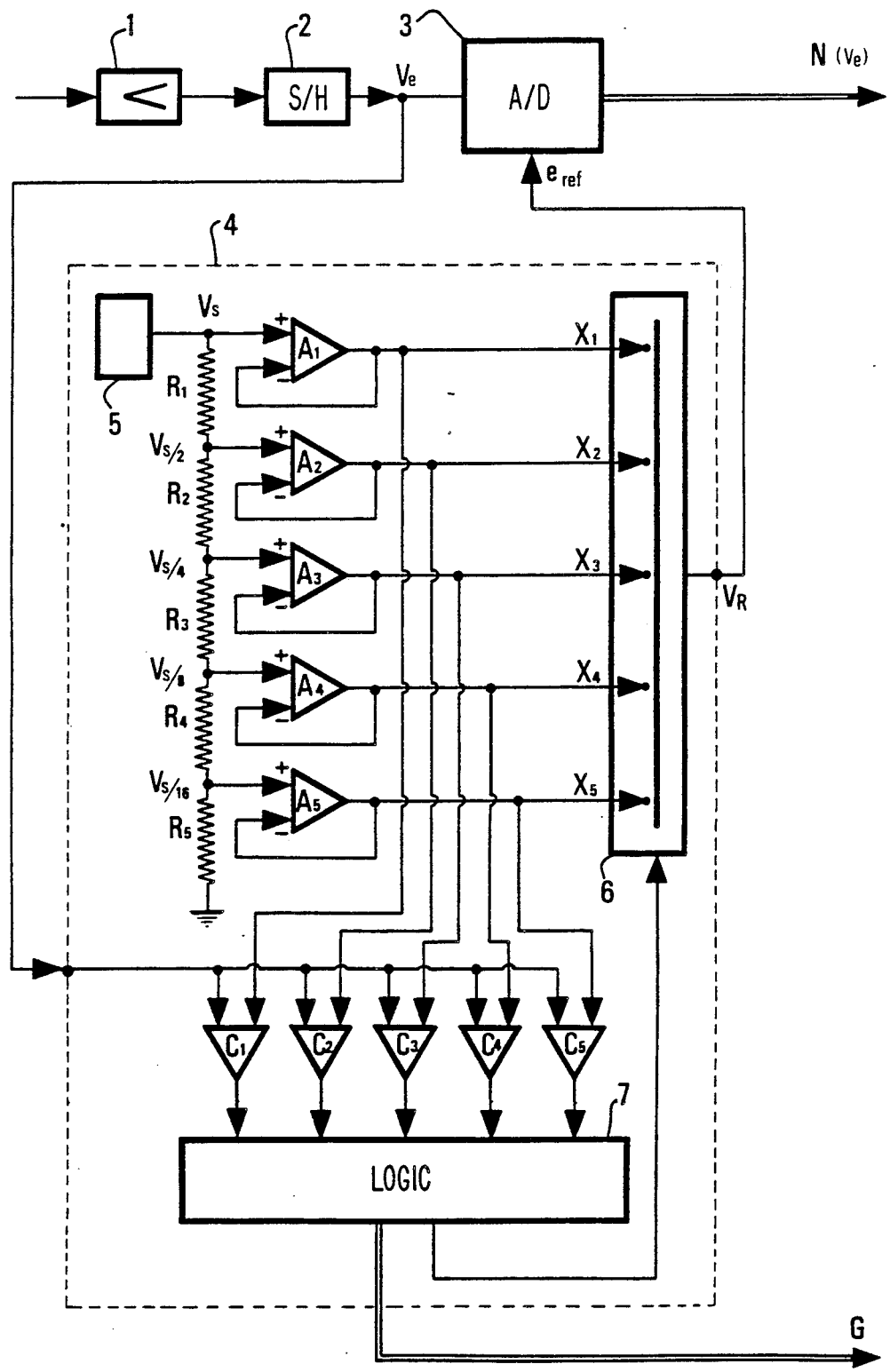

ANALOG TO DIGITAL CONVERTER FOR HIGHLY DYNAMIC SIGNALS, USING A VARIABLE REFERENCE VOLTAGE TO FLOATING DECIMAL POINT OUTPUT

BACKGROUND OF THE INVENTION

The present invention relates to an acquisition device for digitizing highly dynamic signals after possible amplification.

Highly dynamic analog signals are obtained in numerous fields and particularly in the field, of seismic prospecting.

1. Field of the Invention

Methods of seismic prospecting generally comprise the transmission of waves by a seismic source, the reception of these waves after they have been reflected by the different reflecting interfaces of the sub-soil, and the production of seismic recordings representative of the configuration of the sub-soil. The reception of the reflected waves is done by reception devices including a very large number of sensors spread out along a seismic profile to be studied.

For seismic off-shore prospecting, the sensors are spread along and inside a sealed flexible sheath of great length called a seismic streamer.

The assembly of sensors is generally split into a plurality of subassemblies. The signals picked up by the sensors of the same sub-assembly are very often collected by an electronic data acquisition apparatus which digitizes them and records them. At given intervals, the signals recorded by the different acquisition apparati are transmitted sequentially to a central control and recording laboratory through a multiplexed transmission system by means of transmission lines, or by radio. Such a transmission system is described, for example, in French patent No. 2,417,088.

To obtain greater and greater resolution power, seismic reception devices have been developed having an increased number of seismic sensors, which increases accordingly the number and complexity of the acquisition apparati used for collecting all the received signals. It is therefore desirable to employ acquisition simultaneously for performance reliability and relatively low electrical consumption.

The acquisition devices used especially in seismic transmission-reception systems comprise, for example, an analog multiplexer whose different inputs are connected to the different signal sensors, either directly or through fixed gain pre-amplifiers and filters. The output of the multiplexer is connected to a single amplifier formed of several stages connected together in series or in parallel. Each of the stages may be associated with a feed-back network. A selection member chooses the number of amplifiers and/or their respective gains so as to give to each amplified signal a suitable amplitude before applying it to an analog to digital (A-D) converter. The latter transforms each signal sample into a digital word by comparing its amplitude with a fixed reference signal which is applied thereto.

Different amplifiers are described for example in the French patent No. 2,234,709 or the U.S. Pat. Nos. 4,031,504, 3,754,240. The application to a signal of a gain or optimum attenuation very often requires the provision of switching so as to vary the number of stages through which the signal passes and/or the gain or the attenuation applied of each stage and there then arise tuning difficulties due to so-called "offset" voltages, non linearity of the stage and saturation risks. These difficulties are all the greater when amplification stages with limited performance are used for reasons of economy of price or electric consumption, particularly.

SUMMARY OF THE INVENTION

The acquisition device of the invention allows an analog signal to be transformed into digitized signal samples with a relatively simple structure in which the signals applied are practically not altered during the whole phase of their acquisition.

The invention comprises sampling means and an A-D converter adapted for transforming the signal samples delivered successively by the sampling means into digital words, in relation to a reference voltage, and selection means for generating a reference voltage for the converter, which depends on the amplitude of the signals to be digitized.

The invention is characterized in that the selection means comprise a generator producing a stabilized DC voltage of fixed amplitude, a voltage divider means producing a plurality of fixed secondary voltages, and selection means comprising several voltage comparators for comparing the amplitude of each of the successive samples with each of said secondary voltages derived from the stabilized voltage, a switching means for choosing one of the secondary voltages, and a logic assembly for generating a signal for controlling the switching means to chose from among the secondary voltages, the one which is suitable for digitizing each of the successive signal samples to be digitized, and a signal indicative of the secondary voltage chosen.

The means for dividing the stabilized voltage comprises, for example, a network of resistors whose values are chosen so that the secondary voltages are in a given ratio of proportionality with respect to each other.

With such a structure, the signals to be digitized, previously amplified if necessary in a fixed gain amplifier, are applied directly to the sampling and A-D converter means.

BRIEF DESCRIPTION OF THE DRAWING

Other features and advantages of the device of the invention will be clear from the following description of an embodiment given by way of non limitative example, with reference to the accompanying drawing which is a block diagram of the device.

DESCRIPTION OF THE PREFERRED EMBODIMENT

It can be seen in the drawing that the signals to be digitized are applied to a fixed gain amplifier 1 if their level is insufficient. The amplified signals are directed to the input of a sample and hold means 2. The output of the latter is connected to the input of an A-D converter 3. The device comprises an assembly 4 for generating a variable reference voltage. This assembly 4 comprises a stabilized voltage source 5 delivering a very constant voltage $V_S$. A voltage divider network comprising, for example, five resistors $R_1$ to $R_5$ interconnected in series connects the output of voltage source 5 to ground. The values of the different resistors $R_1$ to $R_5$ of the network are chosen so that the voltages measurable at the interconnection nodes of resistors $R_1$ and $R_2$, $R_2$ and $R_3$, $R_3$ and $R_4$, $R_4$ and $R_5$, are respectively equal to $V_S/2$; $V_S/4$, $V_S/8$ and $V_S/16$ for example. The output of source 5 and the different interconnection nodes are connected respectively to the inputs of five buffer amplifiers A1, A2, ... A5. The outputs of these buffer amplifiers are connected to five inputs $X_1, X_2, ... X_5$ of a multiplexer 6. The output of multiplexer 6 is connected to the input $e_{ref}$ of the A-D converter 3 which is adapted to receive the reference voltage and which carries out the conversion of the analog input into digital signals.

The outputs of the buffer amplifiers $A_1$ to $A_5$ are respectively connected also to a first input of five voltage comparators $C_1, C_2, ... C_5$. The second input of each of the comparators is connected to the output of the sample and hold means 2.

The outputs of comparators $C_1$ to $C_5$ are connected to inputs of an assembly of logic gates 7 adapted for selecting the voltage $V_R$ to be applied to the input $e_{ref}$ of the comparator 3 from the voltages available at the inputs $X_1$ to $X_5$ of multiplexer 6, and to deliver a signal G indicative of the gain to be associated with each digital word N(Ve) from the A-D converter 3.

The selection operations may be summed up in the table below where the first column P corresponds to the different variation ranges of voltage $V_e$, defined by the voltages $V_S$, $V_S/2$, $V_S/4$, $V_S/8$ and $V_S/16$; the second column X to the number of an input $X_1$ to $X_5$ of the multiplexer 6 effectively connected to the input $e_{ref}$ of the A-D converter 3 as a function of the range where the input voltage $V_e$ is situated and the third column the three bit digital word G associated with each digital value N(Ve) as a function of the switching effected by the multiplexer 6.

| P | X | G g0 | g1 | g2 |
|---|---|---|---|---|
| $\frac{V_S}{2} < V_e < V_S$ | $X_1$ | 0 | 0 | 0 |
| $\frac{V_S}{4} < V_e < \frac{V_S}{2}$ | $X_2$ | 1 | 0 | 0 |
| $\frac{V_S}{8} < V_e < \frac{V_S}{4}$ | $X_3$ | 0 | 1 | 0 |
| $\frac{V_S}{16} < V_e < \frac{V_S}{8}$ | $X_4$ | 1 | 1 | 0 |
| $V_e < \frac{V_S}{16}$ | $X_5$ | 0 | 0 | 1 |

Each digitized signal sample is therefore defined by two digital words, one N(Ve) corresponding to a mantissa and the other G to an associated exponent. The A-D converter 3 and the different circuits selecting the reference voltage therefore make it possible to digitize very wide dynamic signals.

Without departing from the scope of the invention, the number of variation ranges may be changed, and at the limits of the ranges the reference voltage applied to the A-D converter sample and hold unit, the output of which is connected by choosing other coefficients of proportionality between voltages available at the voltage divider network $R_1$ to $R_5$ instead of the successive powers of 2.

What is claimed is:
1. An acquisition device for sampling and digitizing highly dynamic signals, comprising sampling means for sampling the signals; an analog to digital converter having a signal input connected to said sampling means and having a reference input, for digitizing a signal sample from said sampling means by comparing the amplitude of the sample with a reference voltage applied to said reference input; and selection means for generating a reference voltage as a function of the amplitude of the signal to be digitized, said selection means including:
   a stabilized voltage source for providing a stabilized D.C. voltage of fixed amplitude;
   a single voltage divider coupled between the stabilized voltage source and a fixed reference voltage level for providing a plurality of stabilized secondary voltages;
   a plurality of comparators, each of said comparators having a first input connected to said sampling means to receive the signal sample therefrom, a second input connected to said voltage divider to receive a uniquely associated one of the secondary voltages therefrom, and an output for providing a comparator output signal indicative of the comparison of the signal sample with the associated secondary voltage;
   a logic circuit connected to the outputs of said comparators for providing a control signal indicative of the provided comparator output signals; and
   a switching circuit having a plurality of signal inputs, a control input, and an output, each of said signal inputs connected to the junction of said single voltage divider and the second input of a uniquely associated one of said plurality of comparators to receive the associated one of the secondary voltages from said single voltage divider, said control input connected to said logic circuit to receive the control signal therefrom, said switching circuit responsive to the received control signal for selecting one of the received secondary voltages for application by said switching circuit output to said analog to digital converter reference input as a reference voltage, causing said analog to digital converter to provide a digital output indicative of the amplitude of the signal sample.

2. The acquisition device as claimed in claim 1, wherein said voltage divider comprises a network of dividing resistors interconnected in series and having resistance values selected to provide at the interconnection nodes thereof a determined scale of stabilized secondary voltages.

3. The acquisition device as claimed in claim 1 or 2, wherein said logic circuit comprises means for producing a digital signal which, with the digital output from the analog to digital converter, represents the digitized value of the amplitude of the signal sample from the sampling means.

4. A device for digitizing highly dynamic signals, comprising an analog to digital converter having a signal input and a reference input, for digitizing an analog signal applied to said signal input by comparing the amplitude of the analog signal with a reference voltage applied to said reference input; and selection means for generating a reference voltage as a function of the amplitude of the analog signal, said selection means including:
   a stabilized voltage source for providing a stabilized D.C. voltage of fixed amplitude;
   a single voltage divider coupled between the stabilized voltage source and a fixed reference voltage level for providing a plurality of stabilized secondary voltages;

a plurality of comparators, each of said comparators having a first input adapted to receive the analog signal, a second input connected to said voltage divider to receive a uniquely associated one of the stabilized secondary voltages therefrom, and an output for providing a comparator output signal indicative of the comparison of the analog signal with the associated stabilized secondary voltage;

a logic circuit connected to the outputs of said comparators for providing a control signal indicative of the provided comparator output signals;

a switching circuit having a plurality of signal inputs, a control input, and an output, each of said signal inputs connected to said vol age divider to receive a uniquely associated one of the stabilized secondary voltages therefrom, said control input connected to said logic circuit for receipt of the control signal therefrom, said switching circuit responsive to the received control signal for selecting one of the received stabilized secondary voltages for application to said switching circuit output, said switching circuit output connected to said analog to digital converter reference input to apply thereto, as a reference voltage, the selected one of the stabilized secondary voltages to cause said analog to digital converter to provide a digital output indicative of the amplitude of the analog signal.

5. The acquisition device as claimed in claim 4, wherein said voltage divider comprises a network of dividing resistors interconnected in series and having resistance values selected to provide at the interconnection nodes thereof a determined scale of stabilized secondary voltages.

6. The acquisition device as claimed in claim 4 or 5, wherein said logic circuit comprises means for producing a digital signal which, with the digital output from the analog to digital converter, represents the digitized value of the amplitude of the signal sample from the sampling means.

7. A selection device for generating a reference voltage as a function of the amplitude of an input signal, said selection device including:

a stabilized voltage source for providing a stabilized D.C. voltage of fixed amplitude;

a single voltage divider coupled between the stabilized voltage source and a fixed reference voltage level for providing a plurality of stabilized secondary voltages;

a plurality of comparators, each of said comparators having a first input adapted to receive the input signal, a second input connected to said voltage divider to receive a uniquely associated one of the stabilized secondary voltages therefrom, and an output for providing a comparator output signal indicative of the comparison of the input signal with the associated stabilized secondary voltage;

a logic circuit connected to the outputs of said comparators for providing a control signal indicative of the provided comparator output signals; and a switching circuit having a plurality of signal inputs, a control input, and an output, each of said signal inputs connected to said voltage divider to receive a uniquely associated one of the stabilized secondary voltages therefrom, said control input connected to said logic circuit for receipt of the control signal therefrom, said switching circuit responsive to the received control signal for selecting one of the received stabilized secondary voltages for application to said switching circuit output, said switching circuit output connected to said analog to digital converter reference input to apply thereto, as a reference voltage, the selected one of the stabilized secondary voltages to cause said analog to digital converter to provide a digital output indicative of the amplitude of the input signal.

8. The acquisition device as claimed in claim 7, wherein said voltage divider comprises a network of dividing resistors interconnected in series and having resistance values selected to provide at the interconnection nodes thereof a determined scale of stabilized secondary voltages.

9. The acquisition device as claimed in claim 7 or 8, wherein said logic circuit comprises means for producing a digital signal which, with the digital output from the analog to digital converter, represents the digitized value of the amplitude of the signal sample from the sampling means.

10. The acquisition device as claimed in claim 1, 4, or 7 wherein said switching circuit is a multiplexer.

11. The acquisition device as claimed in claim 1, 4, or 7, wherein said logic circuit includes means for providing a signal indicative of the stabilized secondary voltage selected.

* * * * *